United States Patent [19]

Kushida et al.

[11] Patent Number: 5,038,068
[45] Date of Patent: Aug. 6, 1991

[54] THIN FILM PATTERN AND METHOD OF FORMING THE SAME

[75] Inventors: Keiko Kushida, Kunitachi; Hiroshi Takeuchi, Matsudo; Yukio Ito, Machida; Hiroshi Kanda, Tokorozawa; Kazuhiro Sugawara, Ibaraki, all of Japan

[73] Assignee: Hitachi Construction Machinery Co., Ltd., Tokyo, Japan

[21] Appl. No.: 446,590

[22] Filed: Dec. 6, 1989

[30] Foreign Application Priority Data

Dec. 9, 1988 [JP] Japan ................................ 63-309880

[51] Int. Cl.⁵ .................... H01L 41/08; H01L 21/306; B44C 1/22; C03C 15/00
[52] U.S. Cl. .................................. 310/334; 156/643; 156/644; 156/647; 156/656; 156/659.1; 156/667; 310/364; 310/365; 428/137
[58] Field of Search ............... 29/25.35; 156/643, 644, 156/646, 647, 651, 655, 656, 659.1, 661.1, 667; 310/311, 313 A, 331, 334, 342, 364, 365, 367, 368, 369, 370; 428/134, 135, 137, 209

[56] References Cited

U.S. PATENT DOCUMENTS 3,983,515  9/1976  Mitchell et al. ............ 29/25.35 X
4,106,975  8/1978  Berkenblit et al. ............ 156/647 X
4,354,898  10/1982 Coldren et al. ................... 156/647
4,675,074  6/1987  Wada et al. ....................... 156/647
4,692,653  9/1987  Kushida et al. ................... 310/334

FOREIGN PATENT DOCUMENTS 1-101100  4/1989  Japan .

OTHER PUBLICATIONS

Polla et al., "Monolithic Integrated Zinc-Oxide on Silicon Pyroelectric Anemometer", IEEE, 1983, IEDM 83, pp. 639–642.

Primary Examiner—William A. Powell
Attorney, Agent, or Firm—Antonelli, Terry, Stout & Kraus

[57] ABSTRACT

A thin film pattern and a method of fabricating the thin film pattern available for an ultrasonic transducer are disclosed. That is, an oriented thin film made of a material different from the material of a substrate is formed on the substrate, a mask having a predetermined pattern is formed on the thin film, and anisotropic etching is carried out for the thin film in accordance with the predetermined pattern of the mask, by using an etchant for selectively etching a predetermined crystallographic plane parallel to the surface of the thin film, to form the predetermined pattern in the thin film, thereby obtaining a thin film pattern.

36 Claims, 7 Drawing Sheets

FIG. IA
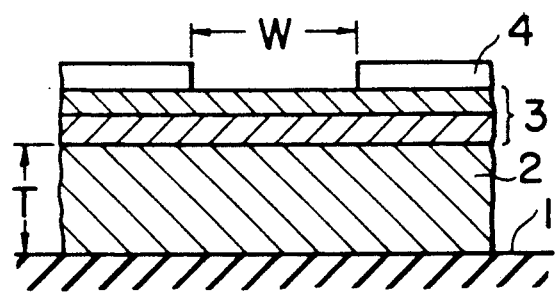
FIG. IB
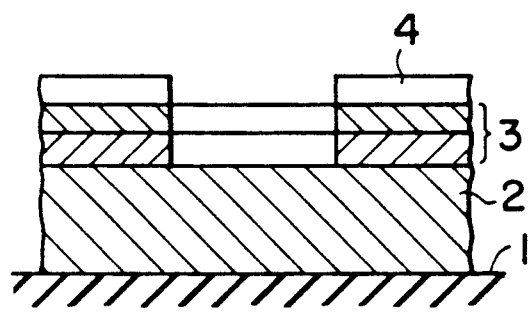
FIG. IC
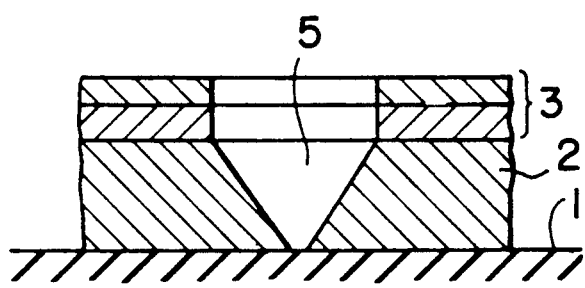
FIG. ID
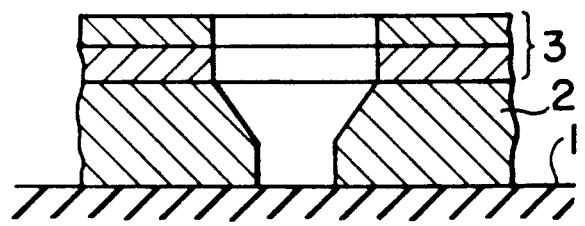
FIG. IE
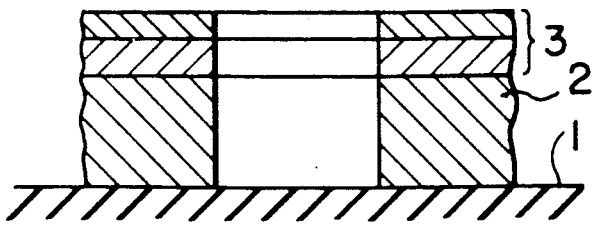

CRYSTAL STRUCTURE OF ZnO

F I G. 3
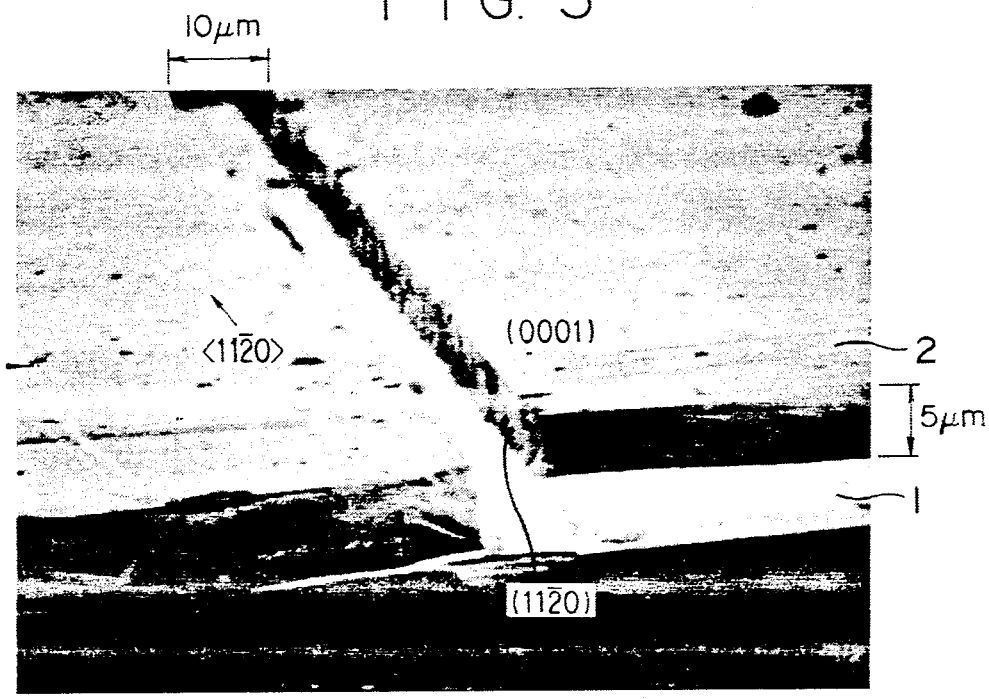
F I G. 5A
F I G. 5B
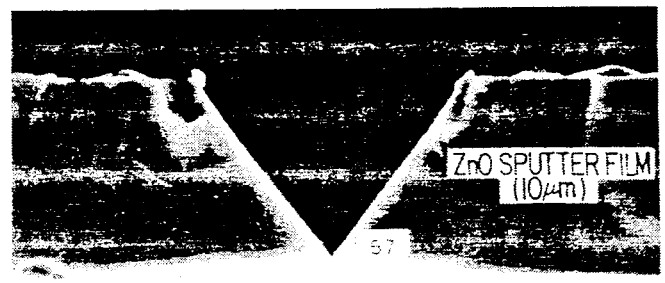

THIN FILM PATTERN AND METHOD OF FORMING THE SAME

BACKGROUND OF THE INVENTION

The present invention relates to a method of forming a pattern in an oriented thin film such as a zinc oxide thin film, and to an oriented thin film pattern.

In recent years, a thin film pattern obtained by forming a pattern in an epitaxial or oriented thin film has been used in various devices.

Specifically, a thin film with a crystal structure belonging to the hexagonal system, for example, a zinc oxide thin film containing zinc oxide as the main component, is widely used as a piezo-electric thin film, an optical wave guide, a transparent conductive film, or a gas sensitive film. In a case where the zinc oxide thin film is used for the above purposes, it is necessary to form a fine pattern in the zinc oxide thin film. Devices which employ a thin film pattern made of zinc oxide, are discussed on pages 639 to 642 of the Proc. of IEDM, 1983.

In general, a fine pattern is formed in a thin film in the following manner. That is, a resist pattern is first formed on the thin film through photolithographic techniques, and then dry etching or wet etching is carried out for the thin film using the resist pattern as a mask. Further, in a case where a fine pattern is formed in a thin film with a crystal structure belonging to the hexagonal system such as a zinc oxide thin film, the thin film has hitherto been etched by one of isotropic etchants such as hydrochloric acid and nitric acid.

When the above thin film is etched by the isotropic etchant, however, that portion of the thin film under the mask, is over-etched, that is, side etching is generated. Thus, there arises a problem that the patterning accuracy is lowered.

Further, in a case where a line pattern is formed in an oriented thin film such as a zinc oxide thin film by the above method, to be used as the thin film elements of a thin film array ultrasonic transducer, there arise the following problems. That is, the dimensional accuracy of each thin film element is lowered, and variations in area of thin film element are increased. Thus, the sensitivity of respective elements vary widely, and moreover an undesirable response such as a side lobe is generated in an ultrasonic beam.

SUMMARY OF THE INVENTION

It is a first object of the present invention to provide a thin film pattern which can obviate the drawbacks of the prior art and is high in patterning accuracy, and to provide a method of forming the thin film pattern.

It is a second object of the present invention to provide the thin film elements of a thin film ultrasonic array transducer which are formed of an oriented thin film and are high in dimensional accuracy to have little differences in their areas, and to provide a method of forming the thin film elements.

In order to attain the first object, according to the present invention, a thin film pattern is formed in such a manner that an oriented thin film is made of a material different from the material of a substrate and is deposited on the substrate, a mask having a predetermined pattern is formed on the thin film, and selective (anisotropic) etching for selectively etching a predetermined crystallographic plane parallel to the surface of the thin film is carried out for the thin film in accordance with the predetermined pattern of the mask, to form the predetermined pattern in the thin film, thereby obtaining the thin film pattern.

In the above case, the anisotropic etching indicates one of anisotropic wet etching and anisotropic dry etching, and the main component of the oriented thin film is preferably a material with a crystal structure belonging to the hexagonal system such as zinc oxide.

In a case where the thin film pattern is formed in the above-mentioned manner, the anisotropic etching (that is, anisotropic wet etching or anisotropic dry etching) for selectively etching a predetermined crystallographic plane parallel to the surface of the oriented thin film such as the zinc oxide thin film, is carried out. Hence, there is no fear of generating side etching. Accordingly, the thin film pattern coincides with the mask pattern with high dimensional accuracy.

The second object of the present invention can be attained by using the thin film pattern which is formed in the above-mentioned manner, as thin film elements for making up the thin film array of an ultrasonic transducer.

In this case, the dimensional accuracy of each thin film element is improved.

Further, when the thickness of the thin film is made not smaller than a maximum gap of the mask pattern, and the anisotropic etching is carried out till a groove between adjacent thin film elements has a V-shaped cross section, a V-shaped groove is formed between the thin film elements.

In a case where a V-shaped groove is formed between adjacent thin film elements, the dimensional accuracy of each thin film element is further improved, and an ultrasonic beam without side lobe can be obtained.

Further, when the oriented thin film is used as a transparent conductive film, and a pattern is formed in the film, a transparent conductive film pattern can be formed with high accuracy.

When the thickness of the thin film is made less than a minimum gap of the mask pattern, and anisotropic etching is carried out till each thin film element has a rectangular cross section, a groove having a rectangular cross section is formed between adjacent thin film elements.

An anisotropic (selective) etchant used for an oriented thin film which contains zinc oxide as the main component, is preferably produced by diluting a solution which is obtained by adding trace amounts of at least one hexavalent chromic compounds (for example, $K_2Cr_2O_7$ or $CrO_3$) to an acid (preferably, an inorganic acid).

BRIEF DESCRIPTION OF THE DRAWINGS

FIGS. 1A to 1E are sectional views showing an example of a method of forming a thin film pattern in accordance with the present invention.

FIG. 3 is a Sem micrograph showing an enlarged image of a thin film pattern which includes a groove having a rectangular cross section.

FIGS. 5A and 5B are microphotographs showing enlarged images of a thin film pattern which includes a groove having a V-shaped cross section.

DESCRIPTION OF THE PREFERRED EMBODIMENTS

Now, embodiments of the present invention will be explained, with reference to the drawings.

Explanation will be made of the first embodiment of the present invention, that is, a thin film pattern according t the present invention and a method of forming the thin film pattern, with reference to FIGS. 1A to 1E. As shown in FIG. 1A, an oriented film (preferably, a material with a crystal structure belonging to the hexagonal system), for example, zinc oxide or a material which contains zinc oxide as the main component, is formed on a substrate 1 by, for example, radio-frequency sputtering using the above material as a target so that a zinc oxide thin film 2 having, for example, the c-axis orientation is formed and the thickness T of the thin film 2 is equal to, for example, 5 μm. Accordingly, a c-plane, that is, a (0001) plane is exposed at the surface of the zinc oxide thin film 2. The substrate 1 is made of, for example, quartz glass. The material of the substrate 1 is required to satisfy a condition that the etching rate of an anisotropic (selective) etchant for that face of the substrate 1 which is put in contact with the zinc oxide thin film 2, is lower than the etching rat of the anisotropic etchant for the zinc oxide thin film 2.

Figure 2:
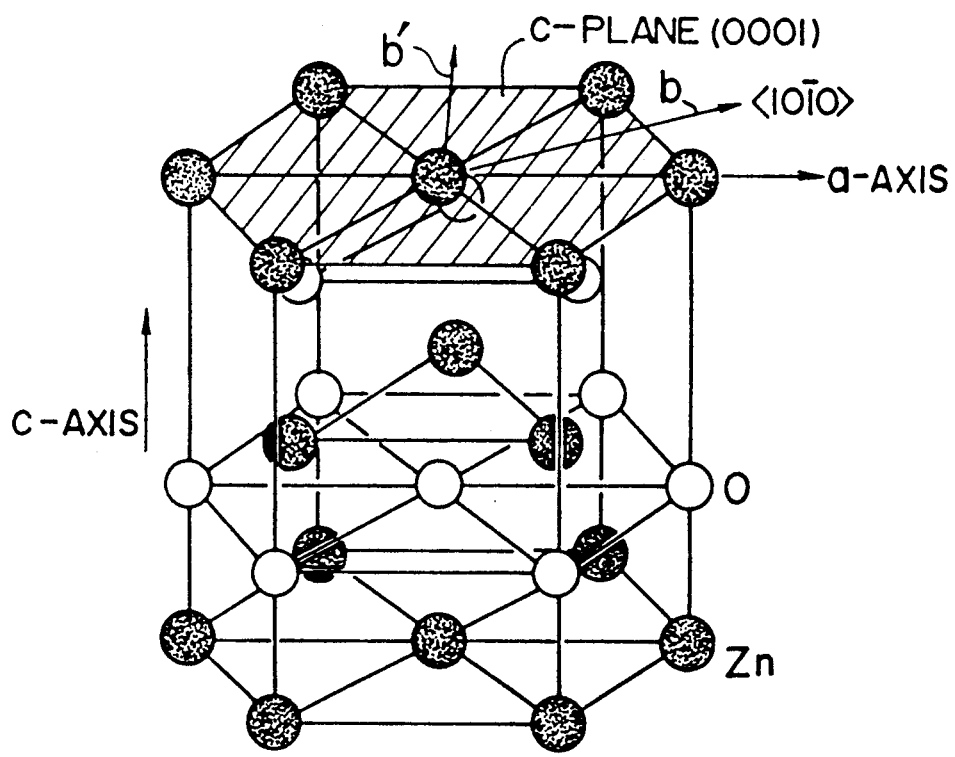
FIG. 2 is a schematic diagram showing the crystal structure of zinc oxide.

FIG. 2 shows the crystal structure of zinc oxide. In FIG. 2, a hatched area indicates a c-plane, that is, a (0001) plane.

Referring back to FIG. 1A, a two-layer film 3 which is made up of, for example, a gold layer and a chromium layer is formed on the zinc oxide thin film 2, and a photoresist layer 4 is formed on the two-layer film 3. Then, a line pattern, in which the gap W between adjacent lines is equal to, for example, 7.5 μm, is formed through photolithographic techniques. Thereafter, as shown in FIG. 1B, etching for the two-layer film 3 is carried out while using the photoresist pattern as a mask, that is, the chromium layer and the gold layer are etched by an acid and an aqueous solution of ammonium iodide, respectively. Thus, the photoresist pattern is transferred to the two-layer film 3, and the two-layer film 3 can be used as a mask. Next, as shown in FIG. 1C, the photoresist layer 4 is removed, and anisotropic etching is carried out for the zinc oxide thin film 2 while using the two-layer film 3 as a mask. In the above anisotropic etching, a c-plane anisotropic etchant for selectively etching the c-plane of a zinc oxide crystal is used. The c-plane anisotropic etchant is produced by diluting a solution which is obtained by adding trace amounts of at least one hexavalent chromic compound ($Cr^{VI}$) to an acid. Preferably, the acid is at least one inorganic acid selected from a group consisting of hydrochloric acid, sulfuric acid, nitric acid, and phosphoric acid, and the hexavalent chromic compound is one of $K_2Cr_2O_7$ and $CrO_3$. In the present embodiment, a solution which is obtained by adding trace amounts of $K_2Cr_2O_7$ to hydrochloric acid and nitric acid, is diluted to obtain the c-plane anisotropic etchant. Thus, when the etching is performed by using this etching solution at room temperature, a V-shaped groove 5 is formed in the zinc oxide film 2 as shown in FIG. 1C. When the etching is continued after the bottom of the groove 5 has reached the substrate 1, the c-plane of a fine crystal grain included in the zinc oxide thin film 2 is etched. Thus, as shown in FIG. 1D, etching proceeds in a lateral direction at that portion of the zinc oxide film 2 which is not coated with the two-layer film 3. When that portion of the zinc oxide film 2 where the c-plane is exposed, is entirely removed as shown in FIG. 1E, the etching rate becomes very low, and an etching is stopped at this state. Accordingly, that portion of the zinc oxide thin film 2 which is covered by the mask pattern (that is, two-layer film 3), is never etched. That is, side etching under the mask pattern is not generated. Thus, a cross section having a very steep slope is obtained. Accordingly, the deviation of the zinc oxide thin film pattern from the mask pattern is very small, and the patterning accuracy of the zinc oxide thin film 2 is improved. In more detail, when the zinc oxide thin film 2 having the c-axis orientation is etched by the c-plane anisotropic etchant, the etching rate in a direction perpendicular to the c-plane, that is, the etching rate for the c-plane is for higher than the etching rate for other crystallographic planes. At that portion of the zinc oxide thin film 2 which is not coated with the mask pattern, the c-plane is exposed, and etching proceeds rapidly in a direction indicative of the thickness of the thin film 2. As the etching proceeds, a facet which is not readily etched by the c-plane anisotropic etchant, is exposed. At this time, however, the c-plane of a microcrystal is exposed, when viewed microscopically. Accordingly, the etching is continued till that portion of the zinc oxide thin film which is not coated with the mask pattern, is entirely removed. At this time, other crystallographic planes such as a ($1\bar{1}01$) plane and a ($11\bar{2}2$) plane are exposed at the side wall of a groove. The etching rate for these planes is far slower than that for the c-plane, that is, the (0001) plane. Accordingly, etching in a lateral direction is not carried out for that portion of the zinc oxide thin film which exists under the mask pattern, that is, side etching is scarecely generated. Thus, a side edge of a groove formed in the zinc oxide film 2 agrees precisely with a side edge on the mask pattern 3, and a problem that a pattern formed in the zinc oxide thin film 2 deviates greatly from the mask pattern, will not arise.

FIG. 3 is a Sem micrograph showing an enlarged image of a thin film pattern which is formed in the following manner. That is, a mask having a line pattern is formed on the upper surface of a c-axis oriented zinc oxide thin film so that the line pattern is drawn by a line extending to a direction $<11\bar{2}0>$ and then etching is carried out for the zinc oxide thin film under the above condition. In this case, the line gap at the mask pattern is equal to 10 μm, and the thickness of the zinc oxide thin film is equal to 5 μm. Further, at the side wall of the rectangular groove 5 formed in the zinc oxide thin film, a ($11\bar{2}0$) plane is exposed.

Figure 4:
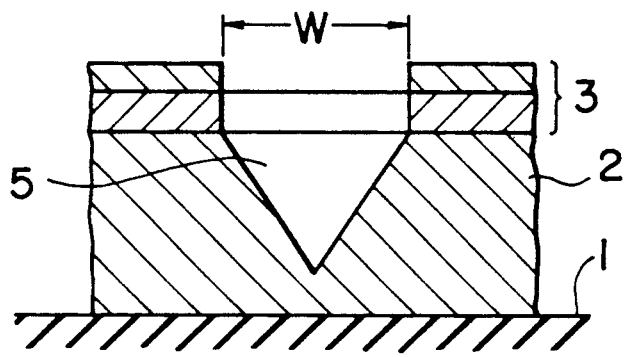
FIG. 4 is a sectional view showing another example of a method of forming a thin film pattern in accordance with the present invention.

Further, in a case where a mask having a line pattern, in which the gap W between adjacent lines is 7.5 μm, is formed on a zinc oxide thin film having a thickness of 10 μm as shown in FIG. 4, the thickness T of the zinc oxide thin film is greater than the line gap W, and hence an etching operation is put in a quasi-stable state when that region of the zinc oxide thin film which exists between adjacent lines of the mask, is etched so as to form a V-shape groove 5. The quasi-stable state is kept for one to two minutes. Accordingly, when the etching operation is stopped at a time the quasi-stable state is obtained, the deviation of the pattern formed in the zinc oxide thin film from the mask pattern is very small. Thus, the patterning accuracy of the zinc oxide thin film is improved in a great degree. FIGS. 5A and 5B are Sem migraphs showing enlarged images of a thin film pattern which is formed in the above-mentioned manner, and correspond to perspective and sectional views of the thin film pattern, respectively. In this case, a line mask pattern is formed on the upper surface (parallel to the c-plane) of a zinc oxide thin film having the c-axis orientation so that the line is drawn by a line extending to a direction $<11\bar{2}0>$, and the zinc oxide thin film is etched under the above-mentioned condition. At the side wall of a V-shaped groove 5, a $(1\bar{1}01)$ plane is exposed. Further, the side wall of the groove 5 is inclined at an angle of about 57° with the upper face of the substrate 1.

Figure 6:
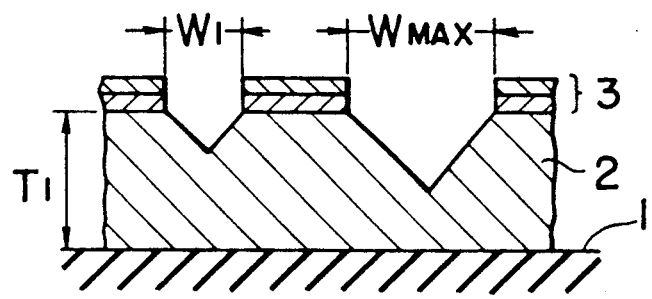
FIGS. 6 and 7 are sectional views for explaining relationship between among the cross section of a groove included in a thin film pattern, the thickness of a thin film, and the gap between lines at a mask pattern.

In order to form the groove 5 having a V-shaped cross section, the zinc oxide thin film has a thickness $T_1$ not smaller than a maximum value $W_{max}$ of the line gap, as shown in FIG. 6. While, in order to form the groove 5 having a rectangular cross section, the zinc oxide thin film has a thickness $T_2$ smaller than a minimum value $W_{min}$ of the line gap. In more detail, the relation between the thickness $T_2$ and the minimum line gap $W_{min}$ is determined in accordance with the direction of the line pattern of the mask.

In a case where lines extending to the a-axis direction of FIG. 2 are formed in the mask, it is necessary to satisfy a relation $W_{min} \geq 1.30/T_2$. While, in a case where lines extending to the b- or b'-direction of FIG. 2 are formed in the mask, it is necessary to satisfy a relation $W_{min} \geq 1.50\ T_2$. Incidentally, the line b extends to a direction $<10\bar{1}0>$.

Next, explanation will be made of the second embodiment of the present invention, that is, a thin film ultrasonic array transducer, in which thin film elements are formed of a thin film pattern according to the present invention.

Figure 8A:
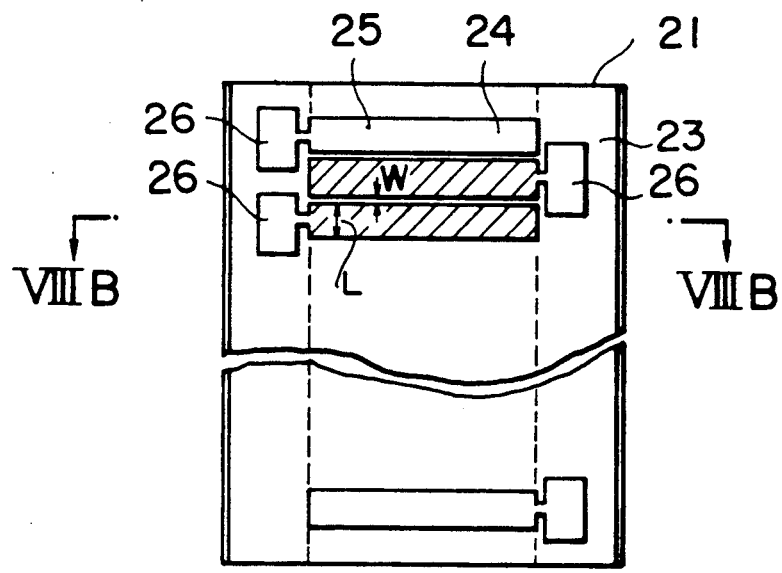
FIGS. 8A to 8D are diagrams for explaining a thin film ultrasonic array transducer which employs a thin film pattern according to the present invention.
Figure 8B:
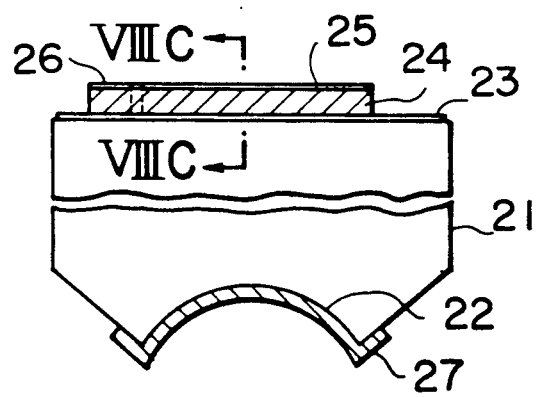
Figure 8C:
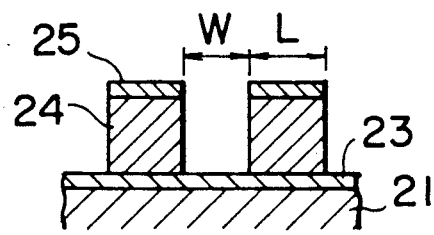

FIG. 8A is a plan view showing the thin film ultrasonic array transducer, FIG. 8B is a sectional view taken along the line VIIIB—VIIIB of FIG. 8A, and FIG. 8C is a sectional view taken along the line VIIIC—VIIIC of FIG. 8B. In FIGS. 8A, 8B and 8C, reference numeral 21 designates a substrate made of, for example, sapphire, 22 a lens portion formed in the sapphire substrate 21, 27 an acoustic matching layer formed on the lens portion 22, 23 a lower electrode which is formed on the upper surface of the sapphire substrate 21 and is made of, for example, gold, and 24 thin film elements formed on the lower electrode 23 which form a thin film array. The thin film elements 24 are made of an oriented material, preferably, a material with a crystal structure belonging the hexagonal system such as zinc oxide. The thin film elements 24 may be made of a material which contains zinc oxide as the main component. Each of the thin film elements 24 has, for example, a rectangular cross section, as shown in FIG. 8C, and has a thickness of, for example, 10 μm. Further, in FIGS. 8A to 8C, reference numeral 25 designates an upper electrode which is formed on the thin film elements 24 and is made of, for example, gold, and 26 a bonding pad led to the upper electrode 25. Further, a chromium or titanium layer (not shown) may preferably be provided between the lower electrode 23 and the substrate 21 in order to improve adhesion therebetween.

Now, explanation will be made of a process for fabricating the thin film array ultrasonic transducer. The lens portion 22 is first formed at one of a pair of end surfaces of the sapphire substrate 21. A lower electrode layer, a zinc oxide thin film and an upper electrode layer are successively formed on the other end surface of the substrate 21. Then, a photoresist pattern is formed on the upper electrode layer through photolithographic techniques so that the width L of each line is equal to, for example, 100 μm and the gap W between adjacent lines is equal to, for example, 10 μm. The zinc oxide thin film has the c-axis orientation, as in the first embodiment. Etching is carried out for the upper electrode layer using the photoresist pattern as a mask, to form the upper electrode 25. At this time, the upper electrode layer is etched by, for example, an etchant containing iodine. Then, the zinc oxide thin film is etched by a c-plane selective (anisotropic) etchant, as in the first embodiment, to form a thin film pattern, that is, the thin film elements 24.

As mentioned above, the thin film elements 24 are formed in such a manner that the zinc oxide thin film is etched by the c-plane selective etchant. Hence, the dimensional difference of the thin film elements 24 from the mask pattern is small. Accordingly, the dimensional accuracy of each thin film element is high, and variations in area of thin film element are reduced. Thus, a thin film ultrasonic array transducer is obtained, in which variations in sensitivity of thin film element are reduced.

The present inventors confirmed that it was possible to reduce the width of each thin film element to 1 μm by the above method.

Figure 8D:
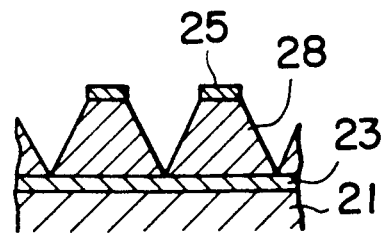

Further, it is not required to separate the thin film elements of the thin film ultrasonic array transducer mechanically from each other, provided that the vibration of one thin film element has no influence on another thin film element and electric coupling between the adjacent elements are prevented. Accordingly, as shown in FIG. 8D, a thin film element 28 may has a trapezoidal cross section. The element 28 can be formed by stopping an etching operation when a V-shaped groove is formed between adjacent thin film elements.

In a case where thin film elements 28 each having a trapezoidal cross section are formed, the dimensional deviation of the thin film elements 28 from the mask pattern is extremely small. Accordingly, the dimensional accuracy of each thin film element is further enhanced, and variations in area of thin film element are greatly reduced. Thus, a thin film ultrasonic array transducer is obtained, in which variations in sensitivity of thin film element are greatly reduced. Further, the present inventors did the sending/receiving experiments of thin film ultrasonic array transducers, and found that the ultrasonic beam emitted from a thin film ultrasonic array transducer provided with the thin film elements 28 each having a trapezoidal cross section, had less side lobe than the ultrasonic beam emitted from a thin film ultrasonic array transducer provided with the thin film elements 24 each having a rectangular cross section. This is because the piezoelectric efficiency is discretely distributed in the ultrasonic transducer provided with the thin film elements 28, and the piezoelectric efficiency is continuously distributed in the thin film array ultrasonic transducer provided with the thin film elements 24.

Figure 7:
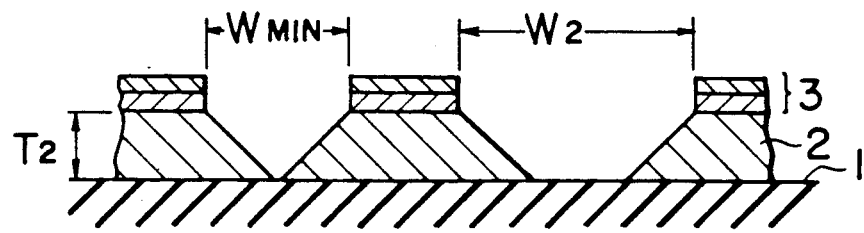

In the present embodiment, a thin film pattern is formed in the same manner as used in the first embodiment. Accordingly, the rectangular and trapezoidal cross sections of a thin film element can be obtained by satisfying conditions which have been explained with reference to FIGS. 7 and 6. Now, in the embodiment of FIGS. 8A to 8D, a line gap W shows a gap with between lines of array pattern (hatched area in FIG. 8A) of the mask pattern.

Figure 9A:
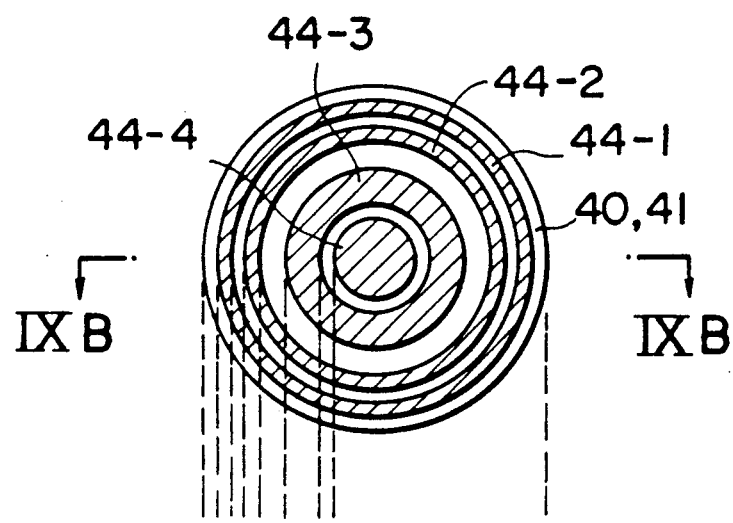
FIGS. 9A and 9B are plan and sectional views showing an ultrasonic annular transducer which is a modification of the thin film array ultrasonic transducer of FIGS. 8A to 8D, respectively.
Figure 9B:
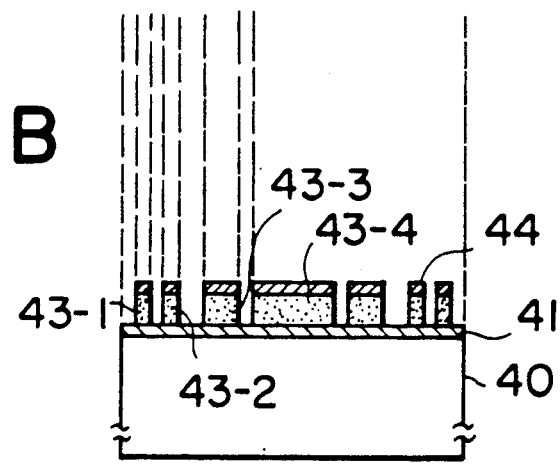

FIGS. 9A and 9B show ultrasonic annular array transducer. In more detail, FIG. 9A is a plan view showing the ultrasonic annular array transducer, and FIG. 9B is a sectional view taken along the line IXB—IXB of FIG. 9A. In FIGS. 9A and 9B, reference numeral 40 designates a substrate, 41 a lower electrode having a two-layer structure and made up of a gold layer and a chromium layer, 43-1 to 43-4 thin film elements made of, for example, zinc oxide, and 44-1 to 44-4 an upper electrode. In this case, a thin film pattern has a concentric-circular structure, but can be formed in the same manner as used in the second embodiment. Accordingly, each thin film element may have a trapezoidal cross section, though the rectangular cross section of each thin film element is shown in FIG. 9B. The same effect can be obtained by the second embodiment.

Figure 10A:
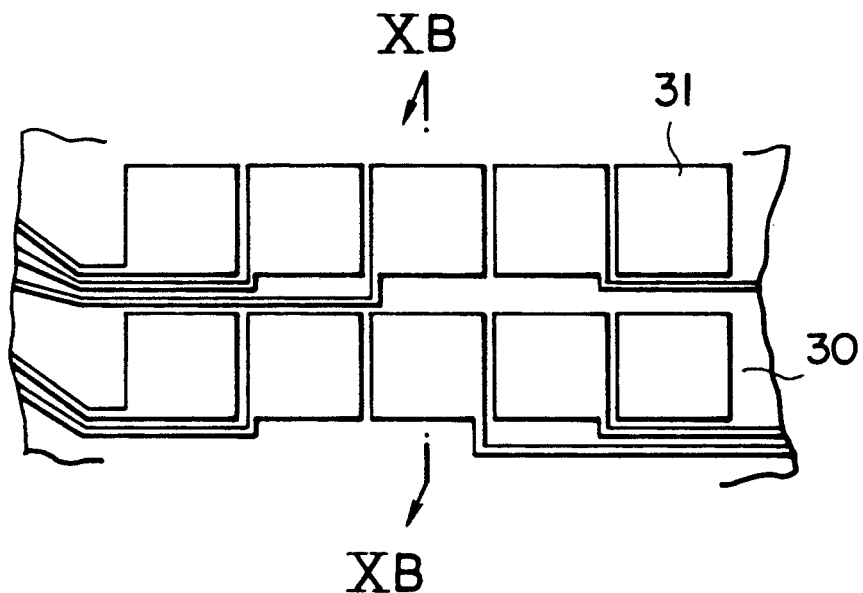
FIGS. 10A and 10B are plan and sectional views showing a transparent conductive pattern according to the present invention, respectively.
Figure 10B:
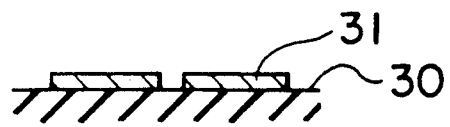

Next, explanation will be made of the third embodiment of the present invention, that is, a method of forming a transparent electrode film pattern in accordance with the thin film pattern forming method of the first embodiment. FIG. 10A is a plan view showing the transparent electrode film pattern, and FIG. 10B is a sectional view taken along the line XB—XB of FIG. 10A. In FIGS. 10A and 10B, reference numeral 30 designates a substrate made of, for example, glass, and 31 a transparent conductive (electrode) film formed on the substrate 30. The transparent electrode film 31 is made of, for example, zinc oxide.

In order to form the transparent electrode film pattern, a c-axis oriented zinc oxide thin film is first grown on the glass substrate 30 to a thickness of, for example, 2,000 Å in such a manner that a small amount of aluminum is added to zinc oxide. Next, a photoresist pattern having a minimum gap of 1 μm is formed on the zinc oxide thin film. Then, etching is carried out for the zinc oxide thin film while using the photoresist pattern as a mask, to obtain the transparent electrode film 31. At this time, the zinc oxide thin film is etched by the same c-plane selective etchant as used in the first embodiment.

As mentioned above, the transparent electrode film 31 is formed in such a manner that the c-axis oriented zinc oxide thin film is etched by the c-plane selective etchant. Accordingly, a transparent electrode film pattern is obtained which is high in dimensional accuracy. When the transparent electrode film pattern is applied to a solar cell, a display device, and others, the performance of each of there devices can be improved. Further, the thickness of the transparent electrode film 31 is smaller than the minimum gap of the mask pattern. Accordingly, a groove having a rectangular cross section is formed between adjacent transparent electrodes, and transparent electrodes are surely isolated from each other.

In the above-mentioned embodiments, a c-axis oriented zinc oxide thin film is used. However, a zinc oxide thin film having the other crystal orientation can also be used. Further, in the first embodiment, the directions of lines included in the mask pattern are made to a direction $<11\bar{2}0>$. However, the lines may have directions different from the above-mentioned. Further, in each of the above-mentioned embodiments, the material of the substrate (or first electrode) on which the zinc oxide thin film is formed, is selected so that the etching rate of the upper face of the substrate (or first electrode) is for lower than the etching rate of the upper surface of the zinc oxide thin film.

In the above-mentioned embodiments, a c-axis oriented zinc oxide thin film is used. However, the present invention is not limited to the zinc oxide thin film, but is applicable to a case where a thin film having orientational texture is made of one of optical materials such as $Z_nS$, $Z_nS_e$, $C_dS$ and $C_dS_e$ or made of a magnetic material such as $C_oC_r$. Further, in the above-mentioned embodiments, a thin film pattern is formed by wet etching. However, dry etching such as the reactive ion etching may be used in place of the wet etching.

As has been explained in the foregoing, according to the present invention, a thin film pattern is formed in such a manner that anisotropic wet etching (or anisotropic dry etching) for selectively etching a predetermined crystallographic plane parallel to the surface of a thin film is carried out for the thin film. Accordingly, there is less prossibility of generating side etching, and the thin film pattern is high in dimensional accuracy.

Further, when a zinc oxide thin film is used to form the thin film elements of a thin film ultrasonic array transducer, the dimensional accuracy of each thin film element is improved, and a thin film ultrasonic array transducer can be obtained in which variations in sensitivity of thin film element are reduced. In this case, when the thin film elements are formed so that a V-shaped groove is formed between adjacent thin film elements, the dimensional accuracy of each thin film element is further improved, and a thin film ultrasonic array transducer can be obtained in which variations in sensitivity of thin film element are greatly reduced. Accordingly, an ultrasonic beam is obtained which has undesirable response only a little. When this thin film ultrasonic array transducer is used for imaging, a precise image can be obtained.

Further, when a zinc oxide thin film is used to form transparent electrodes, a transparent electrode film pattern can be obtained with high dimensional accuracy. Accordingly, a device having the transparent electrode film pattern is sufficiently formed. In this case, when the thickness of the zinc oxide thin film is made smaller than a minimum gap in a mask pattern, a groove having a rectangular cross section is formed between adjacent transparent electrodes, and the transparent electrodes are completely isolated from one another.

We claim:

1. A method of forming a thin film pattern, comprising the steps of:
    forming an oriented thin film on a substrate, the main component of said thin film being zinc oxide;
    forming a mask having a predetermined pattern on the substrate; and
    carrying out anisotropic etching in accordance with the predetermined pattern of the mask to form the predetermined pattern in the thin film in a manner that a predetermined crystallographic plane parallel to the surface of the thin film is selectively etched by the anisotropic etching.

2. A method of forming a thin film pattern as claimed in claim 1, wherein the anisotropic etching is anisotropic wet etching.

3. A method of forming a thin film pattern according to claim 1, wherein the oriented thin film is a c-axis oriented thin film, and the anisotropic etching is carried out by using an etchant which selectively etches a c-plane which is one of the lattice planes forming said thin film and formed in parallel to the surface of said thin film.

4. A method of forming a thin film pattern, comprising the steps of:
forming an oriented thin film on a substrate, the thin film being made of a material different from the material of the substrate, the main component of the thin film comprising zinc oxide having a hexagonal crystal structure;
forming a mask having a predetermined pattern on the substrate; and
carrying out anisotropic wet etching in accordance with the predetermined pattern of the mask to form the predetermined pattern in the thin film in a manner that a predetermined crystallographic plane parallel to the surface of the thin film is selectively etched by the anisotropic etching.

5. A method of forming a thin film pattern, as claimed in claim 4, wherein an etchant which is obtained by adding trace amounts of at least one hexavalent chromic compound to an acid, is used for the anisotropic wet etching.

6. A method of forming a thin film pattern, as claimed in claim 5, wherein the acid is an inorganic acid.

7. A method of forming a thin film pattern, as claimed in claim 5, wherein the acid is at least one selected from a group consisting of hydrochloric acid, sulfuric acid, nitric acid, and phosphoric acid.

8. A method of forming a thin film pattern, as claimed in claim 5, wherein the hexavalent chromic compound is one of $K_2Cr_2O_7$ and $CrO_3$.

9. A method of forming a thin film pattern, as claimed in claim 1, wherein the anisotropic etching is anisotropic dry etching.

10. A method of forming a thin film pattern, as claimed in claim 5, wherein the oriented thin film is a c-axis oriented zinc oxide thin film, and the etchant is a c-plane selective etchant.

11. A method of forming a thin film pattern, as claimed in claim 10 wherein the zinc oxide thin film contains aluminum to form a transparent conductive thin film.

12. A thin film pattern made up of a plurality of thin film elements, wherein the thin film elements are formed by the method of claim 1.

13. A thin film pattern made up of a plurality of thin film elements, wherein the thin film elements are formed by the method of claim 4.

14. A thin film pattern made up of a plurality of thin film elements, wherein the thin film elements are formed by the method of claim 5.

15. A thin film pattern made up of a plurality of thin film elements, wherein the thin film elements are formed by the method of claim 11.

16. A thin film pattern according to claim 15, wherein the thickness of each thin film element is made smaller than a minimum gap at the predetermined pattern of the mask, to form a groove having a rectangular cross section between adjacent thin film elements.

17. In a thin film ultrasonic array transducer including a first electrode formed on a substrate, thin film elements formed on the first electrode and having a preferred orientation, the thin film being made of a material different from the material of the first electrode, and a second electrode formed on the thin film elements, the improvement wherein a thin film pattern is used as the thin film elements, said thin film pattern being formed by a method comprising the steps of:
forming an oriented thin film on a substrate, the thin film being made of a material different from the material of the substrate;
forming a mask having a predetermined pattern on the substrate; and
carrying out anisotropic etching in accordance with the predetermined pattern of the mask to form the predetermined pattern in the thin film in a manner that a predetermined crystallographic plane parallel to the surface of the thin film is selectively etched by the anisotropic etching.

18. A thin film ultrasonic array transducer including a first electrode formed on a substrate, thin film elements formed on the first electrode and having a preferred orientation, the thin film being made of a material different from the material of the first electrode, and a second electrode formed on the thin film elements, the improvement wherein a thin film pattern formed by the method of claim 4 is used as the thin film elements.

19. A thin film ultrasonic array transducer including a first electrode formed on a substrate, thin film elements formed on the first electrode and having a preferred orientation, the thin film being made of a material different from the material of the first electrode, and a second electrode formed on the thin film elements, the improvement wherein a thin film pattern formed by the method of claim 5 is used as the thin film elements.

20. A thin film ultrasonic array transducer according to claim 19, wherein the thin film having a predetermined crystal orientation is a c-axis oriented zinc oxide thin film, and the etchant is a c-plane selective etchant.

21. A thin film ultrasonic array transducer according to claim 20, wherein a groove having a V-shaped cross section is formed between adjacent thin film elements.

22. A thin film ultrasonic array transducer according to claim 21, wherein the thickness of the thin film is not smaller than a maximum gap of the array pattern of the mask.

23. A thin film ultrasonic array transducer according to claim 20, wherein a groove formed between adjacent thin film elements has a rectangular cross section.

24. A thin film ultrasonic array transducer according to claim 23, wherein the thickness of the thin film is made smaller than a minimum gap of the array pattern of the mask.

25. A method of forming the thin film elements of a thin film ultrasonic array transducer, the transducer including a first electrode formed on a substrate, thin film elements formed on the first electrode and formed of an oriented thin film, and a second electrode formed on the thin film elements, the thin film being made of a material different from the material of the first electrode, the method comprising the steps of:
forming an oriented thin film on the first electrode; the oriented thin film being made of a material different from the material of the first electrode;

forming a second electrode layer on the thin film;

forming a mask on the second electrode layer, the mask having a predetermined pattern;

etching the second electrode layer in accordance with the predetermined pattern of the mask; and carrying out anisotropic etching for the thin film in accordance with the predetermined pattern of the mask to form the predetermined pattern in the thin film, thereby obtaining thin film elements in a manner that a predetermined crystallographic plane parallel to the surface of the thin film is selectively etched by the anisotropic etching.

26. A method of forming the thin film elements of a thin film ultrasonic array transducer, as claimed in claim 25, wherein a material with a hexagonal crystal structure is used as the main component of the thin film.

27. A method of forming the thin film elements of a thin film ultrasonic array transducer, as claimed in claim 26, wherein the anisotropic etching is anisotropic wet etching.

28. A method of forming the thin film elements of a thin film ultrasonic array transducer, as claimed in claim 27, wherein the main component of the thin film is zinc oxide.

29. A method of forming the thin film elements of a thin film ultrasonic array transducer, as claimed in claim 28 wherein an etchant which is obtained by adding trace amounts of at least one hexavalent chromic compound to an acid, is used for the anisotropic wet etching.

30. A method of forming the thin film elements of a thin film ultrasonic array transducer, as claimed in claim 29, wherein the step of carrying out anisotropic etching is continued till a groove between adjacent thin film elements has a rectangular cross section.

31. A method of forming the thin film elements of a thin film ultrasonic array transducer, as claimed in claim 29, wherein the step of carrying out anisotropic etching is continued till a groove between adjacent thin film elements has a V-shaped cross section.

32. A method of forming the thin film elements of a thin film ultrasonic array transducer, as claimed in claim 29, wherein the thin film is a c-axis oriented zinc oxide thin film, and the etchant is a c-plane selective etchant.

33. A method of forming the thin film elements of a thin film ultrasonic array transducer, as claimed in claim 32, wherein the material of the first electrode is selected so that the etching rate of the etchant for that surface of the first electrode is lower than the etching rate of the etchant for the crystallographic c-plane of the thin film.

34. A method of forming the thin film elements of a thin film ultrasonic array transducer, as claimed in claim 33, wherein the thickness of the thin film is made smaller than a minimum gap at the predetermined pattern of the mask, and the step of carrying out anisotropic etching is continued till a groove between adjacent thin film elements has a rectangular cross section.

35. A method of forming the thin film elements of a thin film ultrasonic array transducer, as claimed in claim 33, wherein the thickness of the thin film is made not smaller than a maximum gap at the predetermined pattern of the mask, and the step of carrying out anisotropic etching is continued till a groove between adjacent thin film elements has a V-shaped cross section.

36. A method of forming a thin film pattern according to claim 1, wherein said substrate is made of a material different from the material of said thin film.

* * * * *